United States Patent
Su et al.

(10) Patent No.: US 8,453,095 B2
(45) Date of Patent: May 28, 2013

(54) SYSTEMS AND METHODS FOR CREATING FREQUENCY-DEPENDENT NETLIST

(75) Inventors: Ke-Ying Su, Taipei (TW); Ching-Shun Yang, Zhudong Township, Hsinchu County (TW); Jui-Feng Kuan, Zhubei (TW); Hsiao-Shu Chao, Baoshan Township, Hsinchu County (TW); Yi-Kan Cheng, Taipei (TW); Huang-Yu Chen, Zhudong Township, Hsinchu County (TW); Chung-Hsing Wang, Boashan Township, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 40 days.

(21) Appl. No.: 13/176,823

(22) Filed: Jul. 6, 2011

(65) Prior Publication Data
US 2013/0014070 A1    Jan. 10, 2013

(51) Int. Cl.
*G06F 17/50* (2006.01)
(52) U.S. Cl.
USPC ........... 716/129; 716/130; 716/137; 716/138; 716/111; 716/122; 716/123

(58) Field of Classification Search
USPC ................ 716/129, 130, 137, 138, 111, 122, 716/123
See application file for complete search history.

(56) References Cited

U.S. PATENT DOCUMENTS

| | | | |
|---|---|---|---|
| 8,250,506 B2 * | 8/2012 | Bantas et al. ................. | 716/110 |
| 2004/0159915 A1 * | 8/2004 | McAllister et al. ........... | 257/629 |
| 2008/0281476 A1 * | 11/2008 | Bose et al. .................... | 700/300 |
| 2009/0084592 A1 * | 4/2009 | Tsukuda et al. .............. | 174/260 |
| 2010/0213974 A1 * | 8/2010 | Chow et al. .................... | 326/38 |
| 2012/0147578 A1 * | 6/2012 | Jin et al. ........................ | 361/774 |
| 2013/0007692 A1 * | 1/2013 | Yeh et al. ...................... | 716/136 |

* cited by examiner

*Primary Examiner* — Phallaka Kik
(74) *Attorney, Agent, or Firm* — Duane Morris LLP

(57) ABSTRACT

A method includes creating a technology file including data for an integrated circuit including at least one die coupled to an interposer and a routing between the at least one die and the interposer, b) creating a netlist including data approximating at least one of capacitive or inductive couplings between conductors in the at least one die and in the interposer based on the technology file, c) simulating a performance of the integrated circuit based on the netlist, d) adjusting the routing between the at least one die and the interposer based on the simulation to reduce the at least one of the capacitive or the inductive couplings, and e) repeating steps c) and d) to optimize the at least one of the capacitive or inductive couplings.

20 Claims, 8 Drawing Sheets

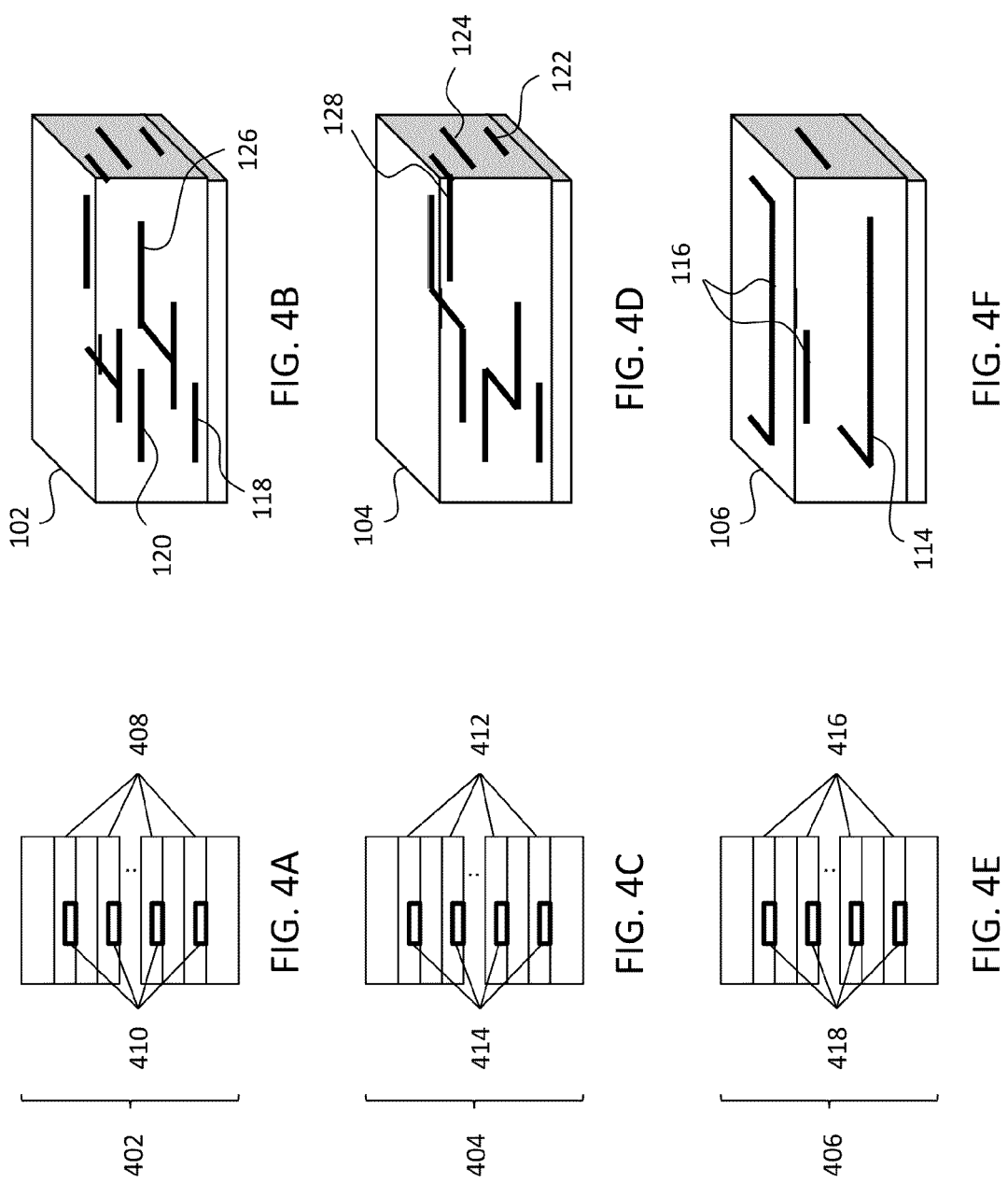

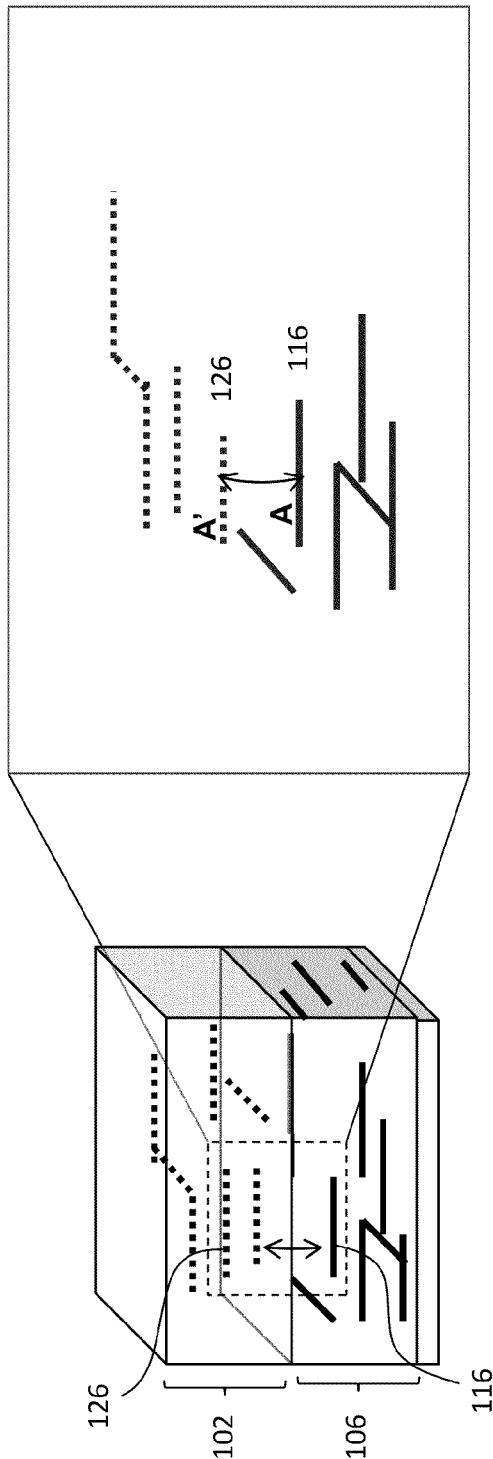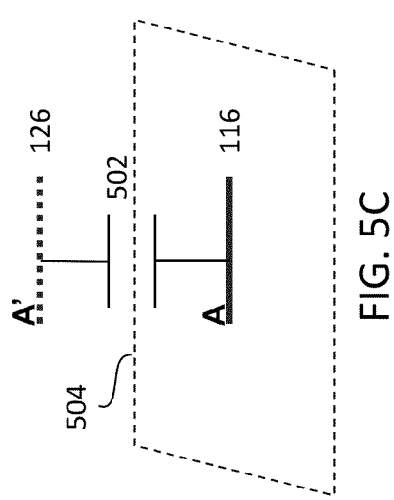

US 8,453,095 B2

SYSTEMS AND METHODS FOR CREATING FREQUENCY-DEPENDENT NETLIST

FIELD

The disclosed system and method relate to integrated circuits. More particularly, the disclosed system and method relate to modeling and fabricating integrated circuits that are connected by an interposer.

BACKGROUND

Integrated circuits ("ICs") are incorporated into many electronic devices. IC packaging has evolved such that multiple ICs may be vertically joined together in so-called three-dimensional ("3D") packages in order to save horizontal area on a printed circuit board ("PCB"). Another packaging method, referred to as 2.5D IC packages, may use an interposer, which may be formed from a semiconductor material such as silicon, for coupling one or more dies to a PCB. Interposers affect the operating characteristics of the ICs that are bonded or otherwise coupled to the interposer due to the resistance and capacitance ("RC") of the semiconductor substrate.

BRIEF DESCRIPTION OF THE FIGURES

FIG. 4A illustrates one example of a graphical representation of an RC tech file for a die in accordance with the semiconductor circuit illustrated in FIG. 1.

FIG. 4B illustrates an example of a design of the die for which the RC tech file in FIG. 4A is created.

FIG. 4C illustrates another example of a graphical representation of an RC tech file for a die in accordance with the semiconductor circuit illustrated in FIG. 1.

FIG. 4D illustrates an example of a design of the die for which the RC tech file in FIG. 4C is created.

FIG. 4E illustrates one example of a graphical representation of an RC tech file for the interposer in accordance with the semiconductor circuit illustrated in FIG. 1.

FIG. 4F illustrates an example of a design of the interposer for which the RC tech file in FIG. 4E is created.

FIG. 5A is an isometric view of one example of a die coupled to an interposer as well as the conductors in each between which capacitive and inductive coupling may occur.

FIG. 5B illustrates the conductors illustrated in FIG. 5A.

FIGS. 5C-5G illustrate example of modeling circuits for capacitive modeling between conductors in dies and interposers.

DETAILED DESCRIPTION

The disclosed system and method advantageously create technology ("tech") files and netlists that account for electrical coupling between dies coupled to an interposer. The tech files and netlists may advantageously be created such that they may be implemented in an existing EDA tools without requiring new simulation engines to be designed. Additionally, the methodology described herein may be applied to develop tech files and netlists that account for thermal stress, power, or other changes in complex physical behaviors.

Figure 1:
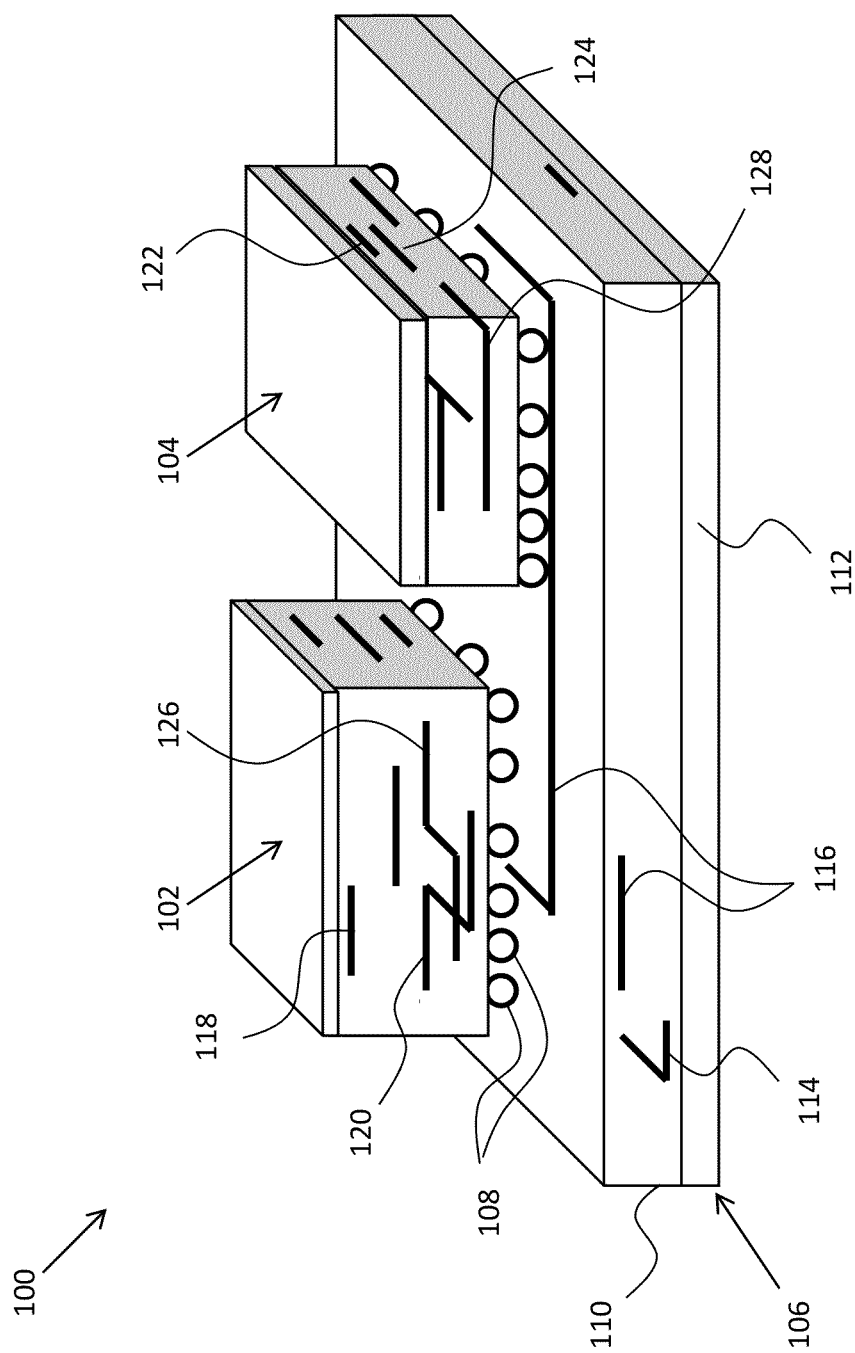
FIG. 1 is a cross-sectional view of one example of integrated circuits coupled to an interposer.

FIG. 1 illustrates one example of a 2.5-dimensional ("2.5D") integrated circuit ("IC") package 100 in which first and second IC chips 102, 104 are coupled to an interposer 106. In some embodiments, IC chips 102 and 104 are fabricated in accordance the same processing technology set forth by the International Technology Roadmap for Semiconductors ("ITRS"), e.g., N28, and in some embodiments, IC chips 102 and 104 are fabricated in accordance with different processing technology, e.g., N65 and N28. As will be understood by one skilled in the art, IC chips 102, 104 may be bonded to interposer 106 using conductive bumps 108, which may be referred to as a "µbump". As will be understood by one skilled in the art, µbumps 108 connecting the IC chips 102, 104 to interposer 106 may have different sizes and electrical properties.

Interposer 106 includes front-side interconnect layer 110 and may be formed from a semiconductor substrate 112. In some applications, substrate 112 is not grounded and thus is electrically floating. Front-side interconnect layer 110 include a plurality of metal layers (e.g., M1, M2, etc.) and dielectric layers for routing signals between IC chips 102 and 104. As shown in FIG. 1, front-side interconnect structure 110 may include one or more conductors 114 disposed in a first metal layer (i.e., M1) and one or more conductors 116 disposed in a second metal layer (i.e., M2).

IC chips 102 and 104 may also include one or more conductors in one or more metal layers. For example, IC chip 102 includes one or more conductors 118 in one metal layer (e.g., M1) and one or more conductors 120 in another metal layer (e.g., M2), and IC chip 104 includes one or more conductors 122 in one metal layer (e.g., M1) and one or more conductors 124 in another metal layer (e.g., M2). Conductor 114 in front-side interconnect layer 110 may be electrically connected to metal conductor 120 in IC chip 102 (not shown) as well as to conductor 124 in IC chip 104 (not shown).

IC chips 102, 104 may also include conductors 126, 128 that are not physically and/or conductively connected to conductor 116 in interconnect layer 110. Although conductor 116 is not conductively connected to conductors 126 and 128, electrical coupling (i.e., capacitive and/or inductive coupling) between conductor 116 and conductors 126 and 128 occurs during operation of 2.5D IC 100. Electrical coupling also can occur between chips 102 and 104. For example, electrical coupling may occur between chip 102 and chip 104 through interposer 106, e.g., die-to-die coupling. The electrical coupling between conductors in the interposer and conductors in ICs coupled to the interposer degrades the performance of the 2.5D IC as conventional simulation software does not analyze the effects of such coupling.

Figure 2:
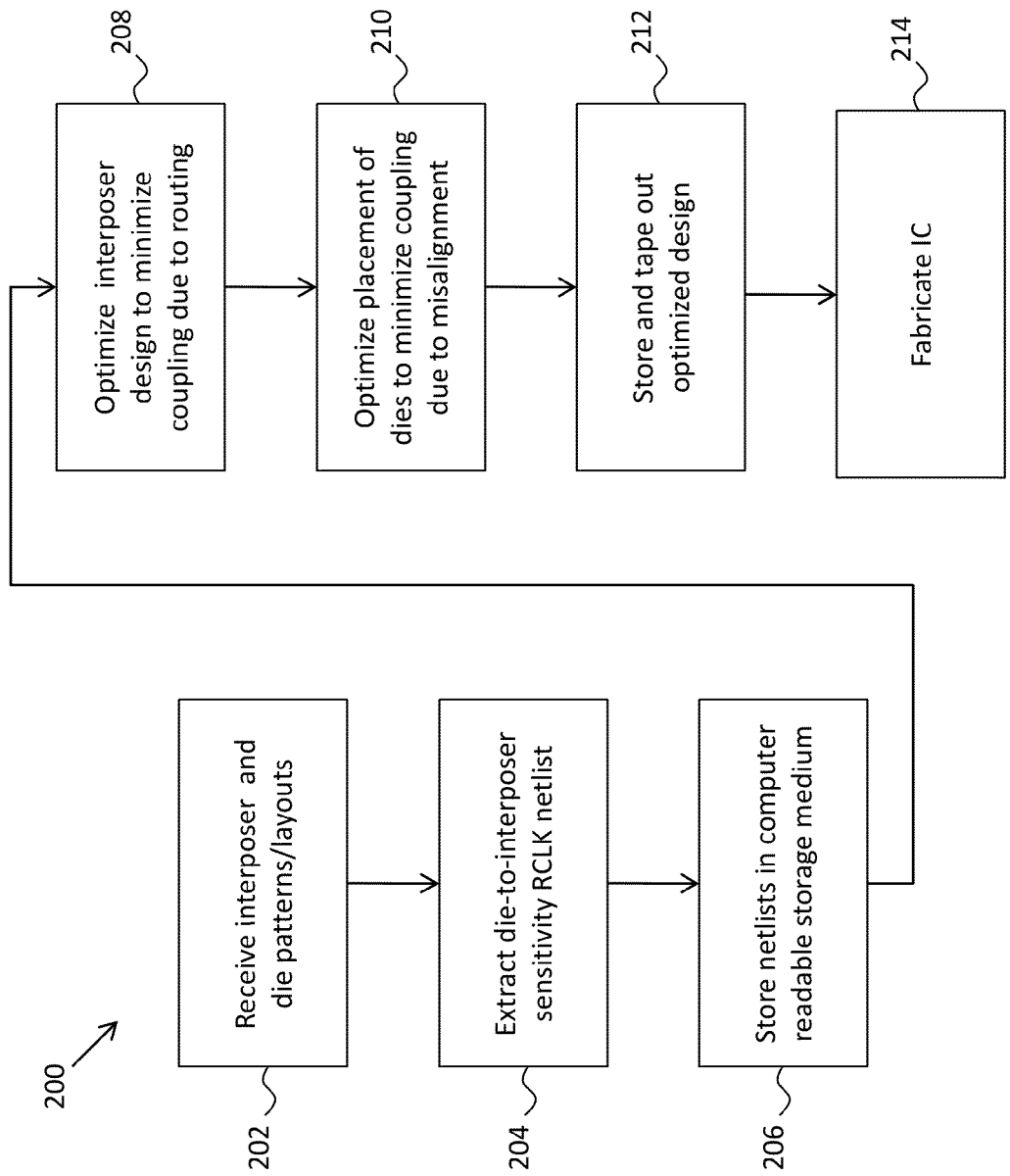
FIG. 2 is one example of a flow chart for generating an improved technology data file.
Figure 3:
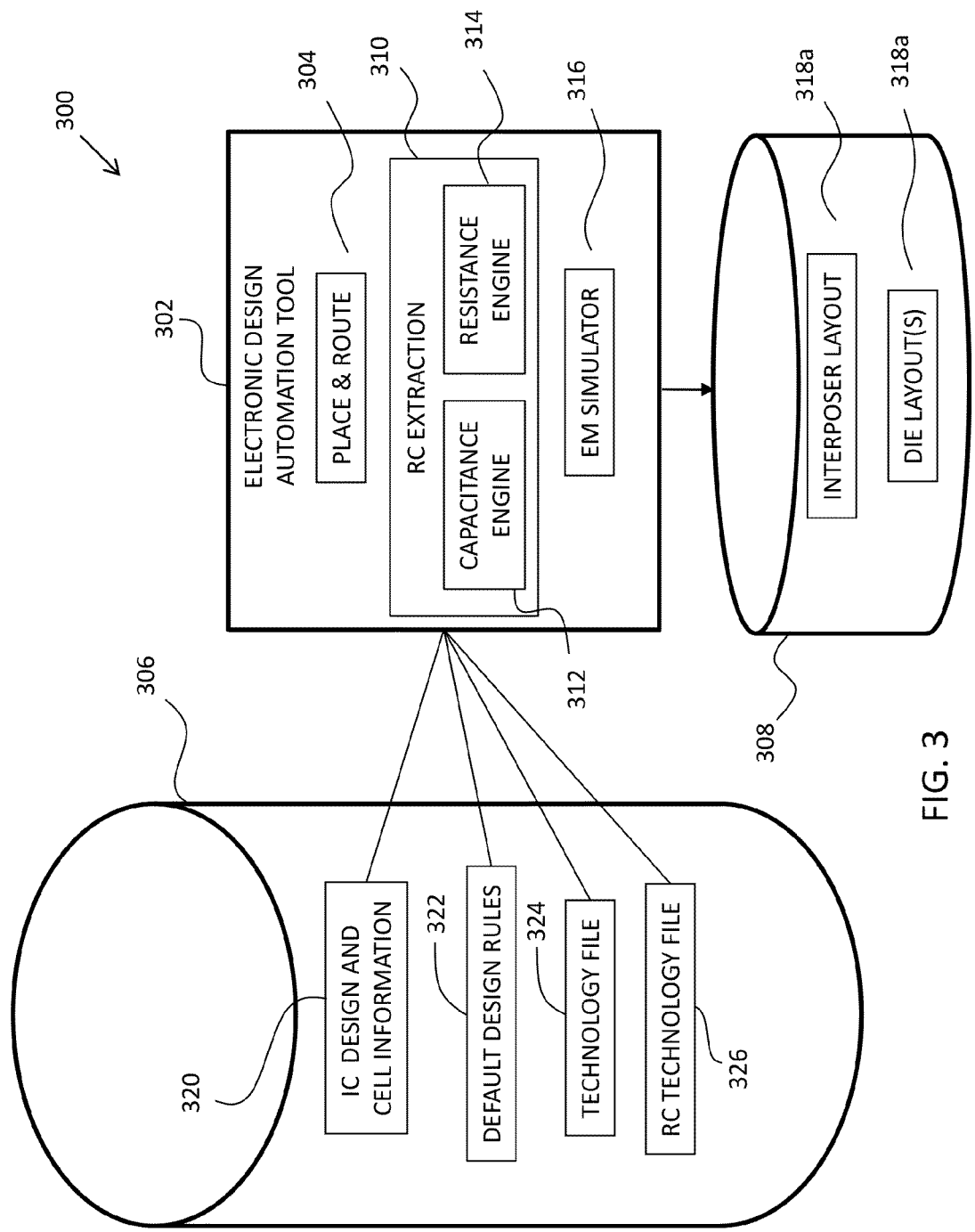
FIG. 3 is a block diagram of one example of a system including an electronic design automation tool.

FIG. 2 is a flow diagram of one example of an improved method 200 for generating an RC tech file that includes physical characteristics that approximate the coupling experienced between dies coupled to an interposer. As will be understood by one skilled in the art, the RC tech file includes process-specific parameters such as layer thicknesses, resistance, capacitance, and s-parameters of various layers. Tech files are used by simulation tools for simulating the response of the proposed IC design under various operating conditions as described in U.S. Patent Application Publication No. US2009/0077507 in the name of Hou et al., entitled "Method of Generating Technology file for Integrated Circuit Design Tools", the entirety of which is incorporated by reference herein. The flow diagram of FIG. 2 may be performed using a system, such as system 300 illustrated in FIG. 3. System 300 includes an electronic design automation ("EDA") tool 302 such as "IC COMPILER"™, sold by Synopsis, Inc. of Mountain View, Calif., which may include a place and route tool 304, such as "ZROUTE"™, also sold by Synopsis. Other EDA tools 302 may be used, such as the "VIRTUOSO" custom design platform or the Cadence "ENCOUNTER"® digital IC design platform may be used, along with the "VIRTUOSO" chip assembly router 304, all sold by Cadence Design Systems, Inc. of San Jose, Calif.

EDA tool 302 is a special purpose computer formed by retrieving stored program instructions from a non-transient computer readable storage medium 306, 308 and executing the instructions on a general purpose processor (not shown). Examples of non-transient computer readable storage mediums 306, 308 include, but are not limited to, read only memories ("ROMs"), random access memories ("RAMs"), flash memories, or the like. Tangible, non-transient machine readable storage mediums 306, 308 are configured to store data generated by the place and route tool 304.

EDA tool 302 also includes an RC extraction tool 310, having a capacitance engine 312 and a resistance engine 314, as well as an electromagnetic ("EM") simulation tool 316. RC extraction tool 310 is configured to perform RC timing analysis of the circuit patterns of interposer 108 such that the RC timing analysis is performed based on the layout.

Router 304 is capable of receiving an identification of a plurality of cells to be included in an integrated circuit ("IC") or interposer layout 318, including a list 320 of pairs of cells within the plurality of cells to be connected to each other. Router 304 may be equipped with a set of default design rules 322 and tech file 324. In addition, an RC tech file 326 developed by process 200 (shown in FIG. 2) provides parameters for coupling between IC chips coupled to the interposer as well as coupling between each chip and the interposer.

Referring again to FIG. 2, an interposer pattern or layout 318 and/or die patterns are received and/or created at EDA tool 302 at block 202. As will be understood by one skilled in the art, the interposer patterns may include the length, width, and thickness of the interposer 106 as well as the lengths, widths, and thicknesses of the conductors in the front-side 110 of interposer 106. The patterns of the IC chips 102, 104 may also include the length, width, and thickness of the conductors in the IC chips 102, 104.

At block 204, one or more resistance-capacitance ("RC") tech files are created for each combination of IC chips 102, 104 and interposer 106. For example, FIGS. 4A, 4C, and 4E respectively illustrate the graphical representations of the RC tech files 402, 404, 406 of IC chips 102, 104 and interposer 106, and FIGS. 4B, 4D, and 4F respectively illustrate the design of the IC chips 102, 104 and interposer 106. Referring first to FIG. 4A, the RC tech file 402 of IC chip 102 includes a plurality of stacked dielectric layers 408 in which a plurality of metal layers 410 are disposed. Conductors 410 correspond to conductors 118, 120, 126 in IC chip 102.

Similarly, RC tech file 404 of IC chip 104 includes a plurality of stacked dielectric layers 412 in which a plurality of conductive layers 414 are disposed. Conductive layers correspond to conductors 122, 124, 128 in IC chip 102. RC tech file 406 of interposer 106 includes a plurality of stacked dielectric layers 416 in which conductive layers 418 are disposed. Conductive layers 418 correspond to conductors 114, 116 in interposer 106.

Figure 4G:
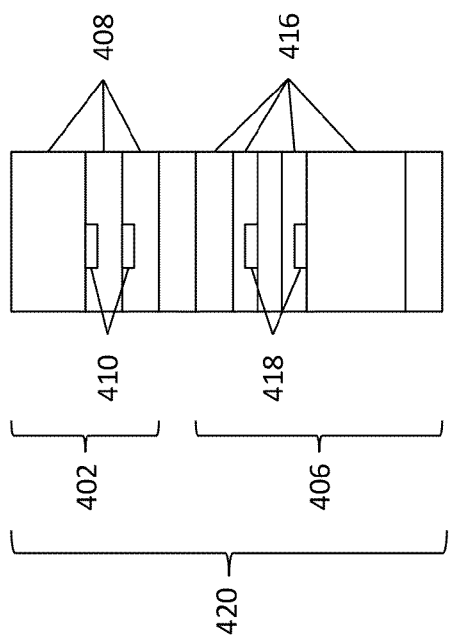
FIG. 4G illustrates one example of a graphical representation of an RC tech file that is a combination of the graphical representations of the RC tech files illustrated in FIGS. 4A and 4E.
Figure 4H:
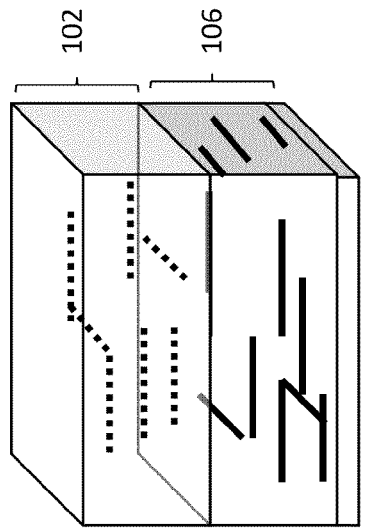
FIG. 4H illustrates an example of a design of a die and interposer for which the RC tech file in FIG. 4G is created.
Figure 4I:
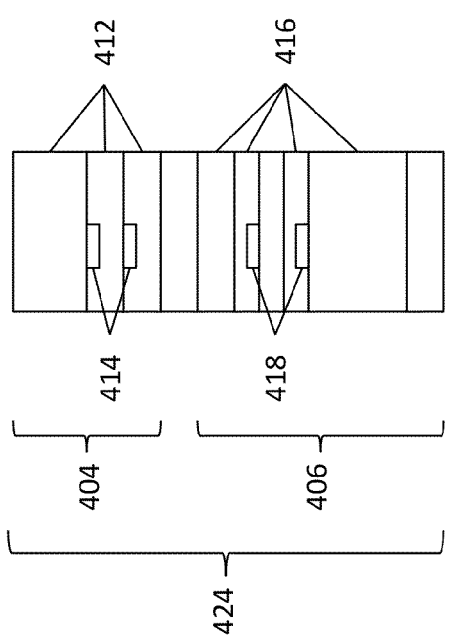
FIG. 4I illustrates another example of a graphical representation of an RC tech file that is a combination of the graphical representations of the RC tech files illustrated in FIGS. 4C and 4E.
Figure 4J:
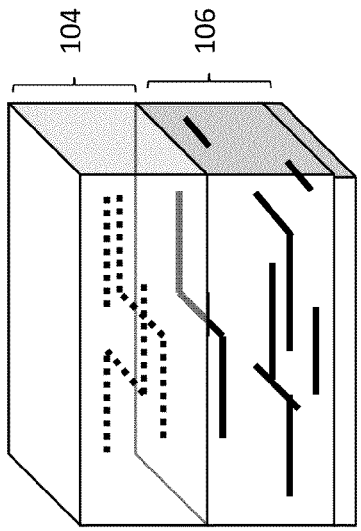
FIG. 4J illustrates an example of a design of a die and interposer for which the RC tech file in FIG. 4I is created.

The RC tech files 402, 404 for the IC chips 102, 104 are combined with the RC tech file 406 for the interposer to create RC tech files 420 and 424 as illustrated in FIGS. 4G and 4I, which correspond to the combination of the IC chips 102, 104 and interposer 106 respectively illustrated in FIGS. 4H and 4J. As shown in FIG. 4G, the RC tech file 420 includes a plurality of dielectric layers 408, 416 in which conductors 410, 418 are disposed. Similarly, RC tech file 424 includes a plurality of stacked dielectric layers 412, 416 in which a plurality of conductors 414, 418 are disposed.

At block 206, one or more die-to-interposer netlists that includes sensitivities for resistance (R), capacitance (C), inductance (L), and mutual inductance (K) are created from the RC tech files. As shown in FIGS. 5A-5D, the sensitivities between physically unconnected conductors may be calculated by modeling the interaction between the conductors and creating a netlist. For example, the capacitive coupling between conductor 126 at node A' in IC chip 102 and conductor 116 at node A in interposer 106. The capacitive coupling, modeled as capacitor 502 in FIG. 5C, may be approximated using the following equation.

$$C = C_0 + S_l \Delta l + S_w \Delta w + S_d \Delta d \quad \text{Eq. 1}$$

Where, $C_0$ is the coupling capacitance between A' and A and is equal to the coupling capacitance per unit length, $C_l$, multiplied by the length, l;

$S_l$ is the sensitivity of length of the polygon defined by conductor 116 within region 504;

$S_w$ is the sensitivity of width of the polygon defined by conductor 116 within region 504; and $S_d$ is the sensitivity of shift of the polygon defined by conductor 116, i.e., a distance from being vertically aligned, within region 504.

Figure 5E:
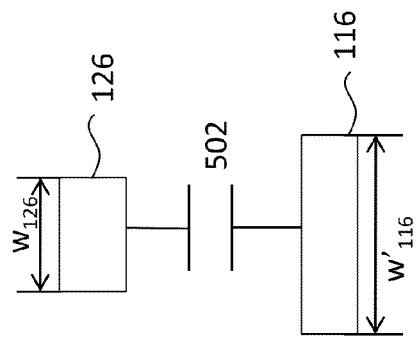
Figure 5G:
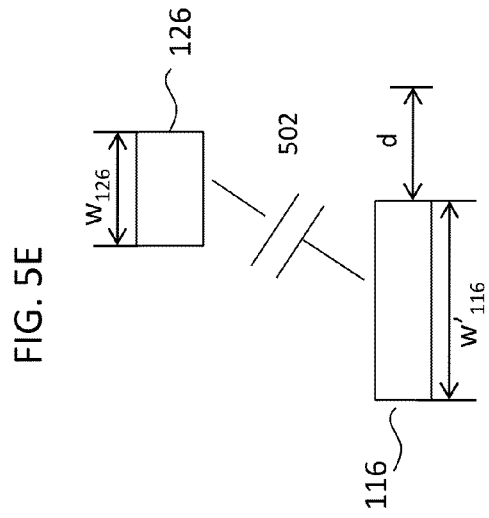
Figure 5D:
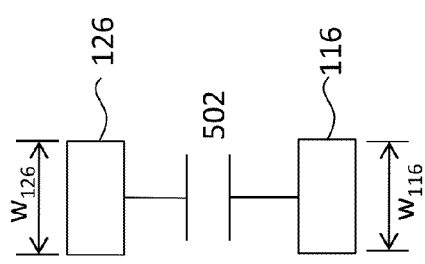
Figure 5F:
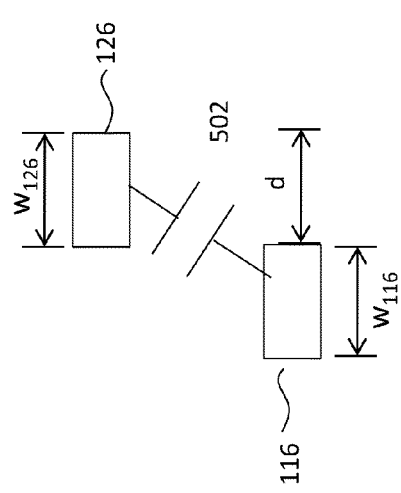

FIGS. 5D-5G illustrates examples in which conductors 126 and 116 have different lengths, widths, and are shifted relative to one another and for which the capacitive coupling may be approximated by using Equation 1. For example, FIG. 5D illustrates an example when the widths and lengths of conductors 126 and 116 are substantially equal and conductors 126 and 116 are substantially aligned with each other (i.e., the shift, d, is equal to zero). FIG. 5E illustrates an embodiment in which conductor 116 has a width, $w'_{126}$, that is greater than a width of conductor 116, $w_{116}$, but the conductors 116, 126 are substantially aligned with one another such that the shift, d, is equal to zero. FIG. 5G illustrates an embodiment similar to the embodiment illustrated in FIG. 5D except that conductor 116 has been shifted relative to conductor 126, i.e., the shift, d, does not equal zero. FIG. 5G illustrates an embodiment in which conductor 116 is shifted relative to conductor 126, i.e., the shift, d, does not equal zero, and conductor 116 has a width, $w'_{126}$, that is greater than a width of conductor 116, $w_{116}$.

Such differences in the lengths, widths, and shifts between various conductors in the dies and interposer may be calculated using Equation 1. For example, if the conductors are of equal lengths, l, widths, w, and are not shifted relative to one another, i.e., $\Delta l$, $\Delta w$, and $\Delta d$ are all equal to zero, then the capacitance of capacitor 502, $C_{502}$ is equal to $C_0$, which is equal to the capacitance per unit length, $C_l$, multiplied by the length, l, such that Equation 1 simplifies to $C_{502} = C_0 = C_l \times l$. If one conductor has a length that is greater than another conductor, e.g., conductor 116 is longer than conductor 126 ($l_{116} > l_{126}$), then the capacitance of capacitor 504 may be approximated using Equation 1 as follows:

$$C_{504} = C_0 + S_l \Delta l$$

Where, $$S_l = C_0;\text{ and}$$

$$\Delta l = l_{116} - l_{126}.$$

The netlist may also include values for the inductance, L, and mutual inductance, K, at a plurality of locations, i.e., nets. As will be understood by one skilled in the art, mutual inductance, K, is proportional to $$K_{ij} \propto \frac{\mu}{4\pi a_i a_j} \int_{V_i} \int_{V_j'} \frac{l_i l_j}{|\vec{r} - \vec{r}'|} dV' dV \qquad \text{Eq. 2}$$

Where,

μ is the magnetic constant;
$a_i$ is a cross-sectional area of a first conductor;
$a_j$ is a cross-sectional area of a second conductor;
$l_i$ is a length of the first conductor;
$l_j$ is a length of the second conductor; and
r is a distance between the first and second conductors.

The sensitivity of mutual inductance, K, may be approximated using the following equation.

$$K = K_0 + S_l \Delta l + S_w \Delta w + S_d \Delta d \qquad \text{Eq. 3}$$

Where, $K_0$ is the is the mutual inductance between A' and A;
$S_l$ is the sensitivity of length of the polygon defined by conductor 116;
$S_w$ is the sensitivity of width of the polygon defined by conductor 116; and
$S_d$ is the sensitivity of shift of the polygon defined by conductor 116, i.e., a distance from being vertically aligned.

At block 206, the netlists derived from the RC tech files are stored in a non-transient computer readable storage medium. For example, the netlists may be stored in data storage 306 and/or in data storage 308. At block 208, the interposer design is optimized to reduce and/or minimize die-to-interposer coupling. For example, EDA tool 300 may perform multiple simulations utilizing the netlists to determine the placement of routing conductors in the interposer that would reduce the coupling between the dies and the interposer.

At block 210, EDA tool 300 performs one or more simulations to reduce and/or minimize the coupling effects due to die-interposer misalignment. The one or more simulations performed by EDA tool 300 EDA tool 300 to determine the effect that a misalignment would have on the IC and to determine an optimum location at which the dies should be located on the interposer such that any misalignment would have limited impact on the function of the circuit.

Figure 6A:
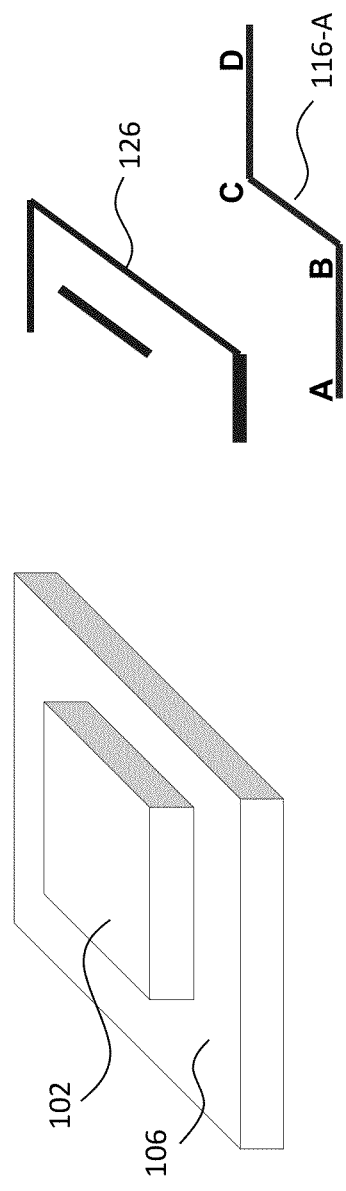
FIGS. 6A and 6B illustrate misalignment of a die relative to an interposer.
Figure 6B:
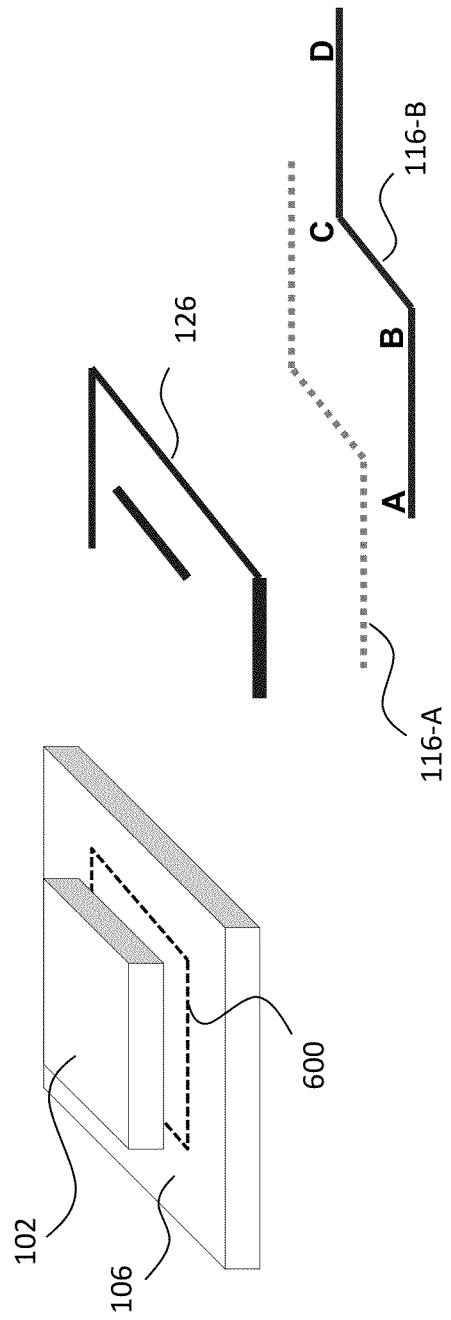

For example, FIG. 6A illustrates a die 102 coupled to interposer 106 in proper alignment with an isolated view of a conductor 126 in die 102 and a conductors 116 in interposer 106 between which electrical coupling is experienced. The respective placement of conductors 126 and 116 in die 102 and interposer 106 may be optimized to reduce coupling as described above. As shown in FIG. 6B, die 102 is shifted, i.e., misaligned, on interposer 106 relative to the position in which die 102 is positioned on interposer 106 in FIG. 6A as identified by reference numeral 600. As will be understood by one skilled in the art, such misalignment may occur during placement of die 102 on interposer 106 and be within a tolerance such that contacts on die 102 are sufficiently aligned with contacts on interposer 106. FIG. 6B also illustrates the difference in the placement between conductor 116-A when die 102 placed in accordance with FIG. 6A and the in FIG. of die 102 and the placement of conductor 116-B when die 102 is misaligned.

At block 212, the optimized design of the IC, including the optimized routing and placement of the dies on the interposer, is stored and taped out. As will be understood by one skilled in the art, the tape out may include the creation of one or more photomasks. At block 214, the IC is fabricated.

In some embodiments, a method includes creating a technology file adapted for use by an electronic design automation tool, creating a netlist based on the technology file, and simulating a performance of the integrated circuit based on the netlist. The technology file includes data for an integrated circuit including at least one die coupled to an interposer and a routing between the at least one die and the interposer, and the netlist includes data approximating at least one of capacitive or inductive couplings between conductors in the at least one die and in the interposer. The routing between the at least one die and the interposer is adjusted based on the simulation to reduce the at least one of the capacitive or the inductive couplings. The simulation and adjusting steps are repeated to optimize the at least one of the capacitive or inductive couplings. A data file representing a model of the integrated circuit is stored in a non-transient computer readable storage medium.

In some embodiments, a system includes a non-transient machine readable storage medium and an RC extraction tool within an EDA tool. The non-transient machine readable storage medium stores at least one technology file generated by the EDA tool. The technology file includes data for an integrated circuit including at least one die coupled to an interposer and a routing between the at least one die and the interposer. The RC extraction tool is configured to i) generate a netlist based on the technology file, the netlist including data approximating at least one of capacitive or inductive coupling between conductors in the at least one die and in the interposer, ii) simulate a performance of the integrated circuit based on the netlist, iii) adjust the routing between the at least one die and the interposer based on the simulation to reduce the at least one of the capacitive or the inductive couplings, and iv) repeat steps ii) and iii) to optimize the at least one of the capacitive or inductive couplings.

In some embodiments, a non-transient machine readable storage medium is encoded with program code, wherein when the program code is executed by a processor, the processor performs a method. The method includes generating a netlist based on a technology file that includes data for an integrated circuits comprising at least one die coupled to an interposer and a routing between the at least one die and the interposer and simulating a performance of the integrated circuit based on the netlist. The netlist includes data approximating at least one of capacitive or inductive coupling between conductors in the at least one die and in the interposer. The routing between the at least one die and the interposer is adjusted based on the simulation to reduce the at least one of the capacitive or the inductive couplings. The simulation and adjusting steps are repeated to optimize the at least one of the capacitive or inductive couplings.

The disclosed systems and methods advantageously create RC tech files and netlists that account for electrical coupling between dies and interposers. The tech files and netlists may advantageously be created such that they may be implemented in an existing EDA tools without requiring significant overhaul to these existing systems. Additionally, the methodology described herein may be applied to develop tech files and netlists that account for thermal stress, power, or other changes in complex physical behaviors.

The methods described herein may be at least partially embodied in the form of computer-implemented processes and apparatus for practicing those processes. The disclosed methods may also be at least partially embodied in the form of computer program code embodied in tangible, non-transient machine readable storage media, such as RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods may also be at least partially embodied in the form of computer program code, whether loaded into and/or executed by a computer, such that, when the computer program code is loaded into and executed by a computer, the computer becomes an apparatus for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the system and method have been described in terms of exemplary embodiments, they are not limited thereto. Rather, the appended claims should be construed broadly, to include other variants and embodiments of the disclosed system and method, which may be made by those skilled in the art without departing from the scope and range of equivalents of the system and method. Delimiters used in the claims—such as 'a)' and 'i)'—should not be taken as imputing any order to the claims, but rather are provided only to serve as visual cues to add in the parsing of the claims and as identifiers in the event that a particular portion of the claim is to be later referenced.

What is claimed is:

1. A method, comprising:
   a) creating a technology file adapted for use by an electronic design automation tool, the technology file including data for an integrated circuit including at least one die coupled to an interposer and a routing between the at least one die and the interposer;
   b) creating a netlist based on the technology file, the netlist including data approximating at least one of capacitive or inductive couplings between conductors in the at least one die and in the interposer;
   c) simulating a performance of the integrated circuit based on the netlist using an electronic design automation tool;
   d) adjusting the routing between the at least one die and the interposer based on the simulation to reduce the at least one of the capacitive or the inductive couplings;
   e) repeating steps c) and d) to optimize the at least one of the capacitive or inductive couplings; and
   f) storing a data file representing a model of the integrated circuit in a non-transient computer readable storage medium.

2. The method of claim 1, wherein the simulation of step c) includes performing at least one of a timing analysis or a frequency domain analysis of the integrated circuit.

3. The method of claim 1, further comprising:
   g) creating masks for the at least one die and the interposer based on the model of the integrated circuit; and
   h) fabricating the integrated circuit.

4. The method of claim 1, wherein the simulation of step c) is performed for the at least one die being disposed in a first position relative to the interposer, the method further comprising:
   g) adjusting a position of the at least one die relative to the interposer such that the at least one die is disposed in a second position relative to the interposer;
   h) simulating a performance of the integrated circuit for the at least one die being disposed in the second position; and
   i) repeating steps g) and h) to determine a final position for the at least one die in relation to the interposer.

5. The method of claim 1, wherein the integrated circuit includes a first die designed using a first processing technology and a second die designed using a second processing technology.

6. The method of claim 1, wherein the netlist includes data approximating both capacitive and inductive coupling between conductors in the at least one die and in the interposer.

7. The method of claim 1, wherein the netlist is a sensitivity netlist that includes coupling sensitivities between conductors.

8. The method of claim 1, wherein the simulation of step (d) simulates adjusted capacitances and inductances that are calculated by sensitivities in the netlist.

9. A system, comprising:
   a non-transient machine readable storage medium storing at least one technology file generated by an electronic design automation ("EDA") tool, the technology file including data for an integrated circuit including at least one die coupled to an interposer and a routing between the at least one die and the interposer; and
   an RC extraction tool within the EDA tool configured to:
   i) generate a netlist based on the technology file, the netlist including data approximating at least one of capacitive or inductive coupling between conductors in the at least one die and in the interposer,
   ii) simulate a performance of the integrated circuit based on the netlist,
   iii) adjust the routing between the at least one die and the interposer based on the simulation to reduce the at least one of the capacitive or the inductive couplings, and
   iv) repeat steps ii) and iii) to optimize the at least one of the capacitive or inductive couplings.

10. The system of claim 9, wherein the simulation includes performing at least one of a timing analysis or a frequency domain analysis of the integrated circuit.

11. The system of claim 9, wherein the simulation is performed for the at least one die being disposed in a first position relative to the interposer, the RC extraction tool within the EDA tool configured to
    v) adjust a position of the at least one die relative to the interposer such that the at least one die is disposed in a second position relative to the interposer,
    vi) simulate a performance of the integrated circuit for the at least one die being disposed in the second position, and
    vii) repeating steps v) and vi) to determine a final position for the at least one die in relation to the interposer.

12. The system of claim 9, wherein the integrated circuit includes a first die designed using a first processing technology and a second die designed using a second processing technology.

13. The system of claim 9, wherein the netlist includes data approximating both capacitive and inductive coupling between conductors in the at least one die and in the interposer.

14. The system of claim 9, wherein the netlist is a sensitivity netlist that includes coupling sensitivities between conductors.

15. The system of claim 9, wherein the simulation simulates adjusted capacitances and inductances that are calculated by sensitivities in the netlist.

16. A non-transient machine readable storage medium encoded with program code, wherein when the program code is executed by a processor, the processor performs a method, the method comprising:
   a) generating a netlist based on a technology file that includes data for an integrated circuits comprising at least one die coupled to an interposer and a routing between the at least one die and the interposer, the netlist includes data approximating at least one of capacitive or inductive coupling between conductors in the at least one die and in the interposer;
   b) simulating a performance of the integrated circuit based on the netlist;
   c) adjusting the routing between the at least one die and the interposer based on the simulation to reduce the at least one of the capacitive or the inductive couplings, and
   d) repeating steps b) and c) to optimize the at least one of the capacitive or inductive couplings.

17. The non-transient machine readable storage medium of claim 16, wherein the simulation includes performing at least one of a timing analysis or a frequency domain analysis of the integrated circuit.

18. The non-transient machine readable storage medium of claim 16, wherein the simulation is performed for the at least one die being disposed in a first position relative to the interposer, the method further including:
   e) adjusting a position of the at least one die relative to the interposer such that the at least one die is disposed in a second position relative to the interposer,
   f) simulating a performance of the integrated circuit for the at least one die being disposed in the second position, and
   g) repeating steps e) and f) to determine a final position for the at least one die in relation to the interposer.

19. The non-transient machine readable storage medium of claim 16, wherein the integrated circuit includes a first die designed using a first processing technology and a second die designed using a second processing technology.

20. The non-transient machine readable storage medium of claim 16, wherein the netlist includes data approximating both capacitive and inductive coupling between conductors in the at least one die and in the interposer.

* * * * *